(12) United States Patent
Liu et al.

(10) Patent No.: US 12,216,497 B2
(45) Date of Patent: Feb. 4, 2025

(54) SUPPORT ASSEMBLY AND DISPLAY APPARATUS

(71) Applicant: Shanghai Tianma Micro-Electronics Co., Ltd., Shanghai (CN)

(72) Inventors: Yong Liu, Shanghai (CN); Jian Jin, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 347 days.

(21) Appl. No.: 17/816,041

(22) Filed: Jul. 29, 2022

(65) Prior Publication Data

US 2022/0374044 A1 Nov. 24, 2022

(30) Foreign Application Priority Data

May 26, 2022 (CN) .......................... 202210589363.8

(51) Int. Cl.
*G06F 1/16* (2006.01)
*G09F 9/30* (2006.01)
*H05K 5/00* (2006.01)

(52) U.S. Cl.
CPC .......... *G06F 1/1641* (2013.01); *G06F 1/1615* (2013.01); *G09F 9/301* (2013.01); *H05K 5/0017* (2013.01)

(58) Field of Classification Search
CPC .... G06F 1/1641; G06F 1/1615; G06F 1/1652; G09F 9/301; H05K 5/0017; F16M 11/04
See application file for complete search history.

(56) References Cited

U.S. PATENT DOCUMENTS

| | | | | |
|---|---|---|---|---|
| 9,786,207 B2 * | 10/2017 | Kim | ........................ | G09F 9/301 |
| 10,001,810 B2 * | 6/2018 | Yoo | ........................ | G06F 1/1652 |
| 10,021,795 B2 * | 7/2018 | Hsu | ........................ | H04M 1/0216 |

(Continued)

FOREIGN PATENT DOCUMENTS

| | | |
|---|---|---|
| CN | 109727538 A | 5/2019 |
| CN | 210112063 U | 2/2020 |
| CN | 113674625 A | 11/2021 |

OTHER PUBLICATIONS

English Translation of the First Chinese Office Action mailed on Feb. 22, 2024, issued in the corresponding Chinese Application No. 202210589363.8 filed on May 26, 2022, 10 pages.

*Primary Examiner* — Rockshana D Chowdhury

(74) *Attorney, Agent, or Firm* — CHRISTENSEN O'CONNOR JOHNSON KINDNESS PLLC

(57) ABSTRACT

A support assembly and a display apparatus are provided. The support assembly includes first and second support units. The first support unit includes a first recessing portion. The second support unit includes a first embedding portion. The first support unit includes first and second surfaces that are opposite to each other. The second support unit includes a third surface and a fourth surface that are opposite to each other. Operating states of the support assembly include a first state and a second state. In the first state, the first embedding portion is embedded in the first recessing portion. In the second state, the first surface and the third surface are disposed in a same horizontal plane, the first surface and the third surface abut against each other, and the second surface and the fourth surface are located at a same side of the support assembly.

20 Claims, 13 Drawing Sheets

(56) References Cited

U.S. PATENT DOCUMENTS

| | | | | |
|---|---|---|---|---|
| 10,143,098 B1* | 11/2018 | Lee | ............ | H05K 5/03 |
| 10,383,239 B2* | 8/2019 | Lee | ............ | H05K 5/0017 |
| 10,599,189 B1* | 3/2020 | Hsu | ............ | G06F 1/1681 |
| 10,761,572 B1* | 9/2020 | Siddiqui | ............ | G06F 1/1616 |
| 10,948,947 B2* | 3/2021 | Yoon | ............ | G06F 1/1652 |
| 11,023,009 B2* | 6/2021 | Kim | ............ | G06F 1/1681 |
| 11,048,305 B1* | 6/2021 | Ye | ............ | G06F 1/1681 |
| 11,169,580 B2* | 11/2021 | Lee | ............ | G09F 9/301 |
| 11,237,596 B2* | 2/2022 | Kim | ............ | G06F 1/1618 |
| 11,391,320 B2* | 7/2022 | Hsu | ............ | E05D 11/0054 |
| 11,579,658 B2* | 2/2023 | Kim | ............ | G06F 1/1626 |
| 11,678,449 B2* | 6/2023 | Lee | ............ | G06F 3/0488 |
| | | | | 361/807 |
| 11,797,046 B2* | 10/2023 | Lee | ............ | G06F 1/1641 |
| 12,032,403 B2* | 7/2024 | Kim | ............ | G06F 1/1652 |
| 2015/0089974 A1* | 4/2015 | Seo | ............ | A44C 5/0076 |
| | | | | 63/1.13 |
| 2015/0131222 A1* | 5/2015 | Kauhaniemi | ............ | G06F 1/1681 |
| | | | | 16/225 |
| 2016/0227645 A1* | 8/2016 | Hampton | ............ | G06F 1/1681 |
| 2018/0103552 A1 | 4/2018 | Seo et al. | | |
| 2018/0329460 A1* | 11/2018 | Song | ............ | G06F 1/1626 |
| 2020/0166969 A1* | 5/2020 | Lee | ............ | G06F 1/1681 |
| 2020/0359515 A1* | 11/2020 | Choi | ............ | G06F 1/1681 |

* cited by examiner

SUPPORT ASSEMBLY AND DISPLAY APPARATUS

CROSS-REFERENCE TO RELATED APPLICATION

The present application claims priority to Chinese Patent Application No. 202210589363.8, filed on May 26, 2022, the content of which is incorporated herein by reference in its entirety.

TECHNICAL FIELD

The present disclosure relates to the field of display technologies, and, particularly, relates to a support assembly and a display apparatus.

BACKGROUND

With the continuous development of science and technology, more and more electronic display devices are used in people's daily life and work, which has brought great convenience to people's daily life and work, and has become indispensable.

Compared with conventional display apparatuses that cannot be deformed by bending, flexible display apparatuses can change their use states through bending deformation to meet various usage requirements of users. Therefore, flexible display apparatuses have gradually attracted people's attention. When a flexible display apparatus is subjected to external effects such as pressing, defects such as dents are likely to occur.

SUMMARY

A first aspect of the present disclosure provides a support assembly. The support assembly includes at least one first support unit and at least one second support unit. The first support unit includes a first recessing portion and includes a first surface and a second surface that are opposite to each other. The second support unit includes a first embedding portion and includes a third surface and a fourth surface that are opposite to each other. Operating states of the support assembly include a first state and a second state. In the first state, the first embedding portion is embedded in the first recessing portion. In the second state, the first surface and the third surface are disposed in a same horizontal plane, the first surface and the third surface abut against each other, and the second surface and the fourth surface are located at a same side of the support assembly.

A second aspect of the present disclosure provides a display apparatus. The display apparatus includes a display panel and a support assembly. The support assembly includes at least one first support unit and at least one second support unit. The first support unit includes a first recessing portion. The second support unit includes a first embedding portion and includes a third surface and a fourth surface that are opposite to each other. Operating states of the support assembly include a first state and a second state. In the first state, the first embedding portion is embedded in the first recessing portion. In the second state, the first surface and the third surface are disposed in a same horizontal plane, the first surface and the third surface abut against each other, and the second surface and the fourth surface are located at a same side of the support assembly.

BRIEF DESCRIPTION OF DRAWINGS

In order to better illustrate technical solutions of embodiments of the present disclosure, the accompanying drawings used in embodiments are briefly described below. The drawings described below are merely a part of some embodiments of the present disclosure. Based on these drawings, those skilled in the art can obtain other drawings.

DESCRIPTION OF EMBODIMENTS

In order to better understand the technical solutions of the present disclosure, some embodiments of the present disclosure are described in detail below Referring to the accompanying drawings.

It should be clear that the described embodiments are only some embodiments of the present disclosure, but not all of the embodiments. Based on the embodiments in the present disclosure, all other embodiments obtained by those of ordinary skill in the art without creative efforts fall within the protection scope of the present disclosure.

The terms used in some embodiments of the present disclosure are only for the purpose of describing specific embodiments, and are not intended to limit the present disclosure. As used in some embodiments of the present disclosure and the appended claims, the singular forms "a/an" "the" and "said" are intended to include the plural forms as well, unless the context clearly dictates otherwise.

It should be understood that the term "and/or" used in this document is only an association relationship to describe the associated objects, indicating that there can be three relationships, for example, A and/or B, which can indicate that A alone, A and B, and B alone. The character "/" in this document generally indicates that the related objects are an "or" relationship.

It should be understood that although the terms 'first', 'second' and 'third' can be used in the present disclosure to describe surfaces, these surfaces should not be limited to these terms. These terms are used only to distinguish surfaces from each other. For example, without departing from the scope of the embodiments of the present disclosure, a first surface can also be referred to as a second surface. Similarly, the second surface can also be referred to as the first surface.

The present disclosure provides a support assembly. Operating states of the support assembly include a first state and a second state. Exemplarily, the support assembly can cooperate with a flexible display panel to be applied to a display apparatus. When the display apparatus includes a scrolling display device, the first state includes a rolling-up state of the display apparatus, and the second state includes an unfolding state of the display apparatus. When the display apparatus includes a foldable display apparatus, the first state includes a folding state of the display apparatus, and the second state includes an unfolding state of the display apparatus.

Figure 1:
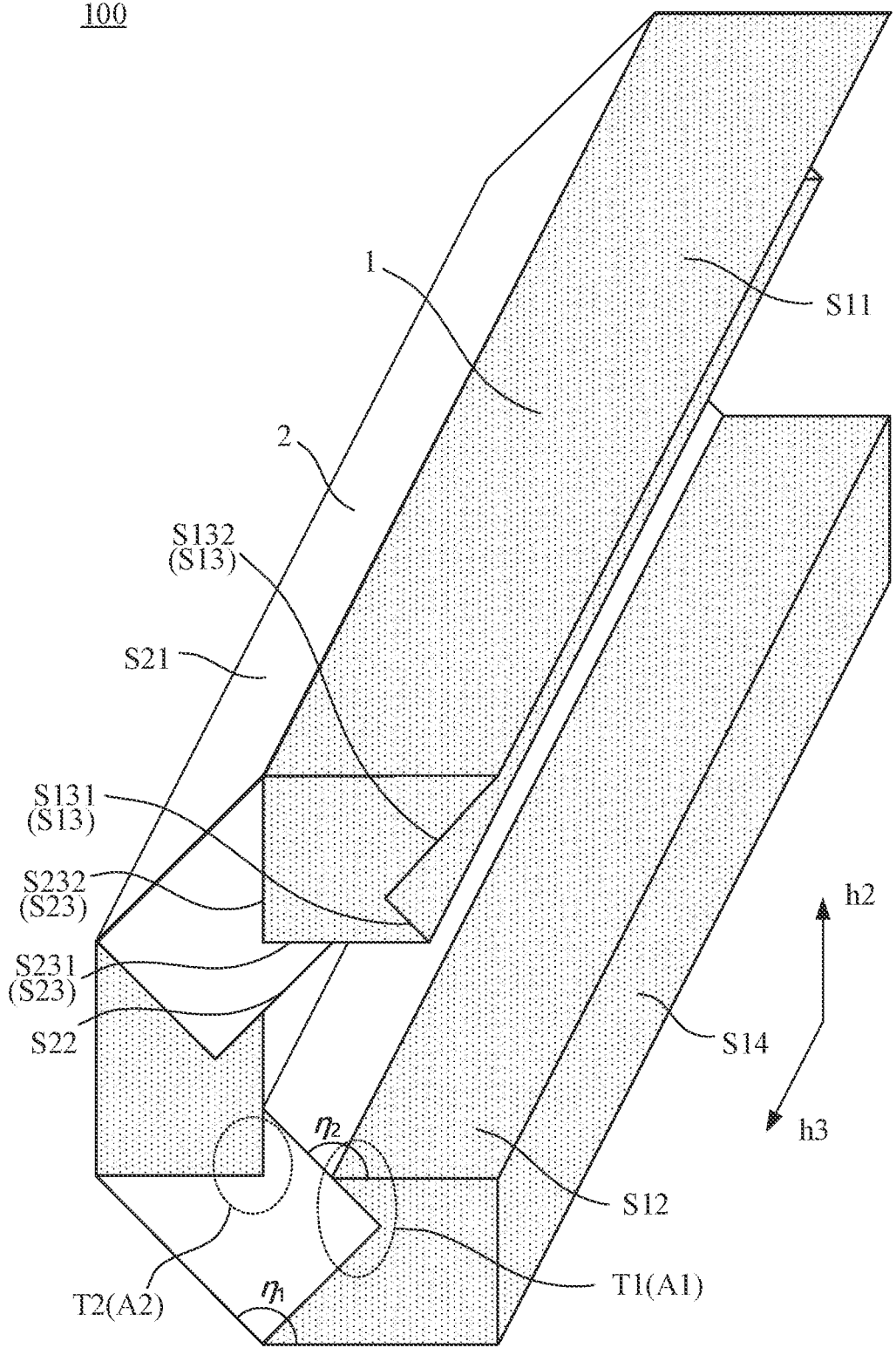
FIG. 1 is a schematic perspective view of a partial region of a support assembly in a first state provided by some embodiments of the present disclosure.
Figure 2:
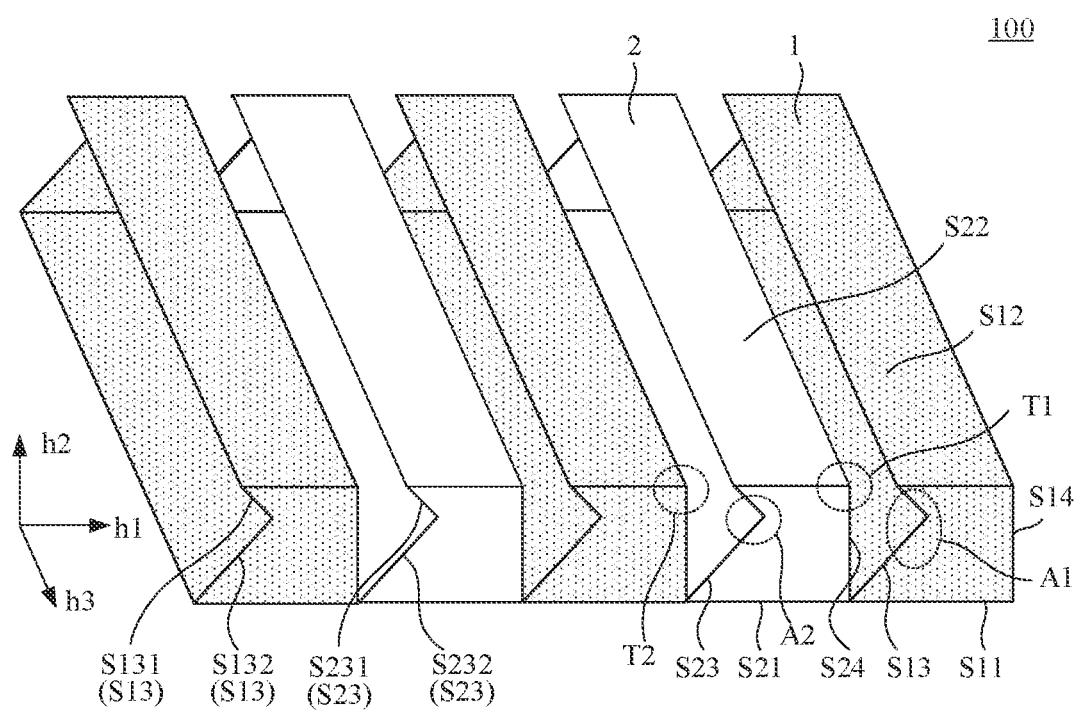
FIG. 2 is a schematic perspective view of a partial region of a support assembly in a second state provided by some embodiments of the present disclosure.
Figure 3:
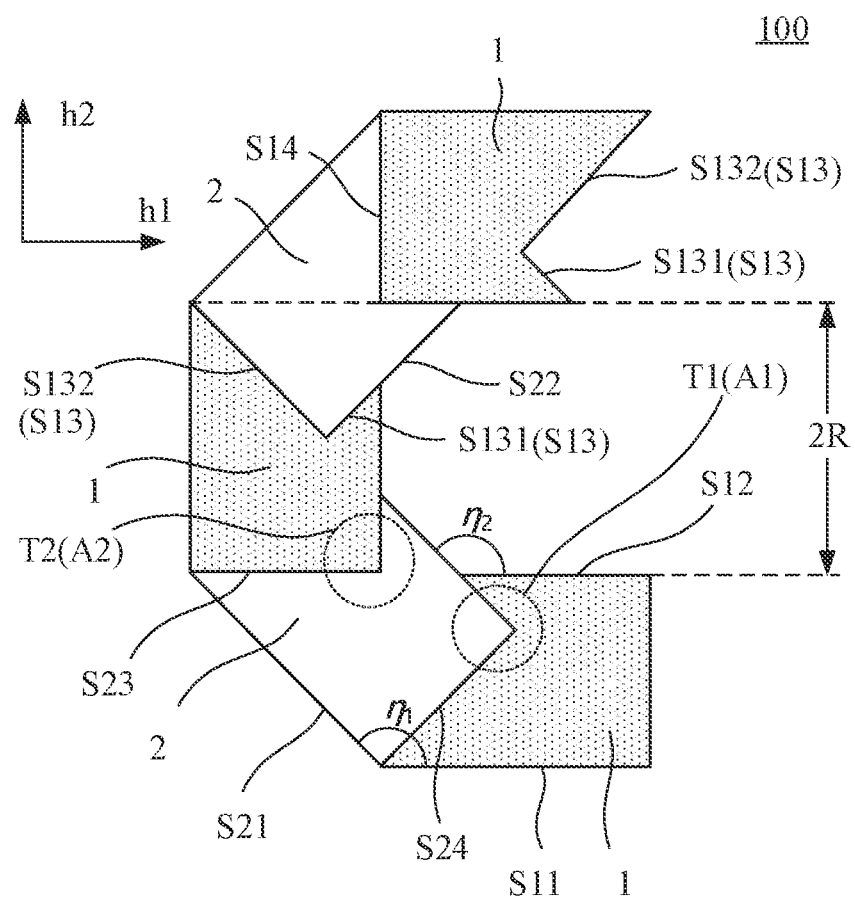
FIG. 3 is a schematic cross-sectional view of a partial region of a support assembly in a first state provided by some embodiments of the present disclosure.
Figure 4:
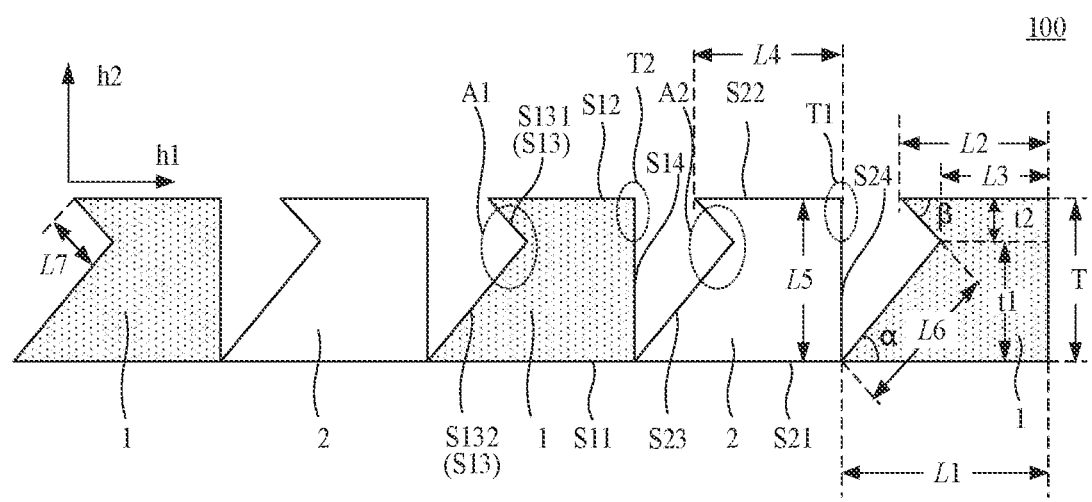
FIG. 4 is a schematic cross-sectional view of a partial region of a support assembly in a second state provided by some embodiments of the present disclosure.

FIG. 1 is a schematic perspective view of a partial region of a support assembly in a first state provided by some embodiments of the present disclosure; FIG. 2 is a schematic perspective view of a partial region of a support assembly in a second state provided by some embodiments of the present disclosure; FIG. 3 is a schematic cross-sectional view of a partial region of a support assembly in a first state provided by some embodiments of the present disclosure; and FIG. 4 is a schematic cross-sectional view of a partial region of a support assembly in a second state provided by some embodiments of the present disclosure. As shown in FIG. 1, FIG. 2, FIG. 3 and FIG. 4, the support assembly 100 includes a first support unit 1 and a second support unit 2. The first support unit 1 includes a first recessing portion A1, and the second support unit 2 includes a first embedding portion T1. The first recessing portion A1 is located at a side of the first support unit 1 close to the second support unit 2, and the first embedding portion T1 is located at a side of the second support unit 2 close to the first support unit 1.

Figure 5:
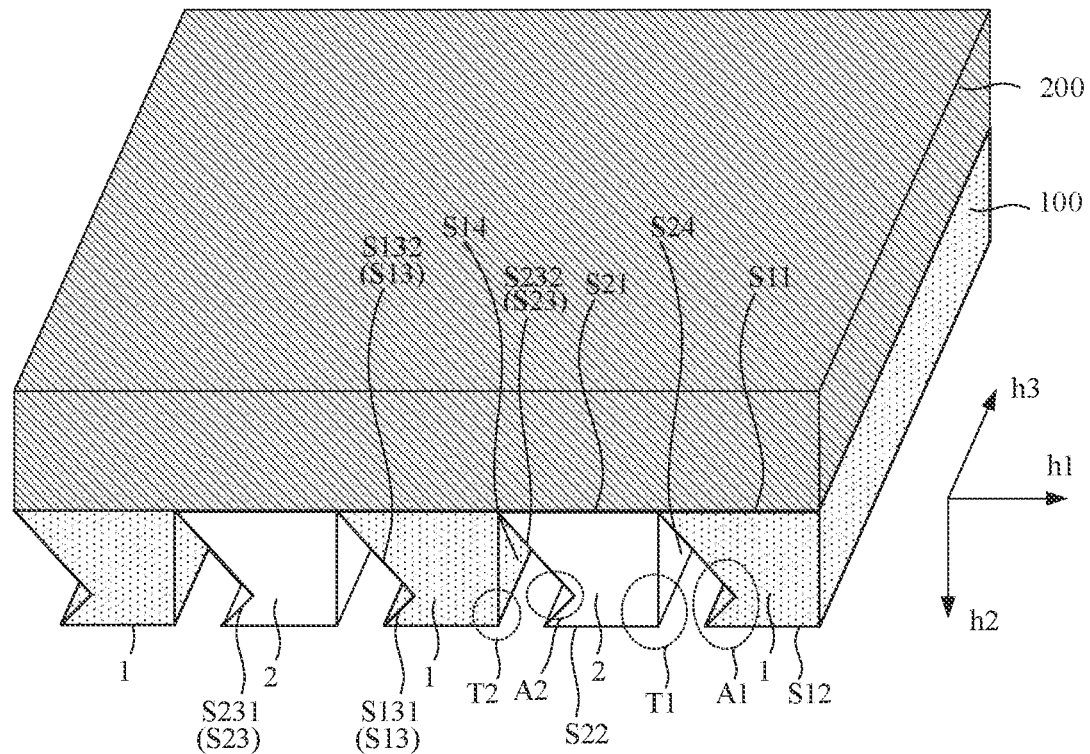
FIG. 5 is a schematic perspective view of a flexible display panel and a support assembly in a second state provided by some embodiments of the present disclosure.
Figure 6:
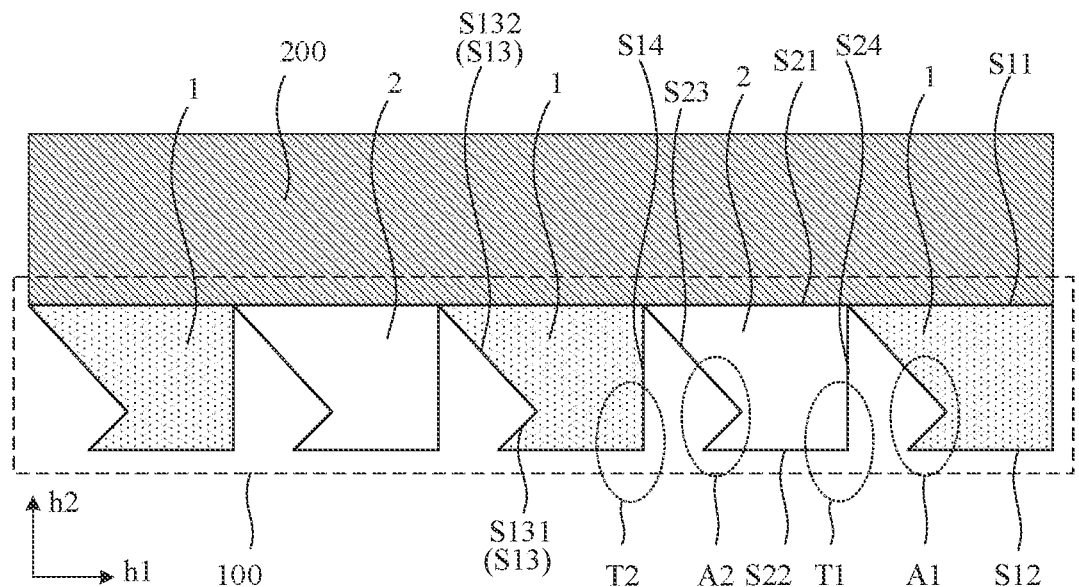
FIG. 6 is a schematic cross-sectional view of a flexible display panel and a support assembly in a second state provided by some embodiments of the present disclosure.

Exemplarily, the support assembly 100 can be arranged in cooperation with the flexible display panel to provide support for the flexible display panel in different operating states. FIG. 5 is a schematic perspective view of a flexible display panel and a support assembly in a second state provided by some embodiments of the present disclosure, and FIG. 6 is a schematic cross-sectional view of a flexible display panel and a support assembly in a second state provided by some embodiments of the present disclosure. Taking the shape of the flexible display panel as a quadrilateral as an example, as shown in FIG. 5 and FIG. 6, in some embodiments of the present disclosure, the flexible display panel 200 can be arranged at a side of the first surface S11 away from the second surface S12. The flexible display panel 200 includes a group of opposite sides provided oppositely in a first direction h1, and another group of opposite sides provided oppositely in a third direction h3. A thickness direction of the flexible display panel 200 is a second direction h2. The first direction h1, the second direction h2, and the third direction h3 intersect one another in pairs.

When providing the support assembly 100, exemplarily, as shown in FIG. 1 and FIG. 2, in some embodiments of the present disclosure, both the first support unit 1 and the second support unit 2 can be configured as approximately columnar structures extending along the third direction h3. In a second state, as shown in FIG. 2, the first support unit 1 and the second support unit 2 are arranged along the first direction h1 to increase the support area of the first support unit 1 and the second support unit 2 to the flexible display panel 200. The first support unit 1 includes a first surface S11 and a second surface S12 that are oppositely provided along the second direction h2. The second support unit 2 includes a third surface S21 and a fourth surface S22 that are oppositely provided along the second direction h2. As shown in FIG. 2, in the second state, the thickness direction of the support assembly 100 is the second direction h2.

Exemplarily, when the support assembly 100 including the first support unit 1 and the second support unit 2 are prepared, in some embodiments of the present disclosure, a first surface S11 of the first support unit 1 is arranged corresponding to a third surface S21 of the second support unit 2; a second surface S12 of the first support unit 1 is arranged corresponding to a fourth surface S22 of the second support unit 2; the first surface S11 and the third surface S21 are located at a same side of the support assembly 100; and, the second surface S12 and the fourth surface S22 are located at a same side of the support assembly 100.

Exemplarily, as shown in FIG. 1 and FIG. 3, in the first state, an angle η1 between the first surface S11 of the first support unit 1 and the third surface S21 of the second support unit 2 can be an obtuse angle, and the first embedding portion T1 is embedded in the first recessing portion A1.

As shown in FIG. 2 and FIG. 4, in the second state, the first surface S1 and the third surface S21 are in a same horizontal plane, that is, an angle formed between the first surface S11 and the third surface S21 is 180°, and, the first surface S11 and the third surface S21 abut against each other. The term "abut against" refers to that one end of the first surface S11 is in contact with one end of the third surface S21, and there is no gap between the end of the first surface S11 and the end of the third surface S21, and the first surface S11 and the third surface S21 do not overlap in a thickness direction of the support assembly 100. With such configuration, the first surface S11 of the first support unit 1 and the third surface S21 of the second support unit 2 can jointly form a plane.

In some embodiments of the present disclosure, one end of the third surface S21 of the second support unit 2 away from the first support unit 1 can be rotated relative to one end of the third surface S21 close to the first support unit 1, so as to embed or separate the first embedding portion T1 and the first recessing portion A1, so that the support assembly 100 is switched between the first state and the second state.

When the support assembly 100 is provided at a side of the flexible display panel 200 so that when the support assembly 100 supports the flexible display panel 200, the shape of the flexible display panel 200 can also be changed under the driving of the support assembly 100. For example, the display panel 200 can be bent, rolled, folded, etc., to match the shape of the support assembly 100 in the first state and the second state. In some embodiments of the present disclosure, the support assembly 100 can support the flexible display panel 200 in different operating states.

In the support assembly 100 provided by some embodiments of the present disclosure, the first support unit 1 and the second support unit 2 are provided, and the first recessing portion A1 and the first embedding portion T1 are respectively provided in the first support unit 1 and the second support unit 2 T1, by making the first recessing portion A1 and the first embedding portion T1 embed with each other in the first state, the volume of the support assembly 100 can be reduced. Meanwhile, it can also ensure that the support assembly 100 has a stable structure in the first state. In the second state, in some embodiments of the present disclosure, the first surface S11 and the third surface S21 are at the same level and abut against each other, so as to avoid forming a gap between the first surface S11 and the third surface S21, so that the support assembly 100 can provide a flat bearing surface for the flexible display panel 200, which can provide good support and protection for the flexible display panel 200. When the flexible display panel 200 is pressed, defects such as pits can be avoided.

Exemplarily, in the support assembly 100, the first support unit 1 and the second support unit 2 each can be an integrated single-layer structure. Such configuration not only helps to reduce the thickness of the support assembly 100 and makes the support assembly 100 to easily switch between different states, but also eliminates the need to provide an adhesive layer in the support assembly 100, so that when the support assembly 100 switches between different states, creases, wrinkles, or bulges can be avoided.

In the first state, as shown in FIG. 1 and FIG. 3, the first surface S11 of the first support unit 1 and the third surface S21 of the second support unit 2 can also abut against each other, so as to avoid a gap formed between the first surface S11 and the third surface S21 of the second support unit 2, so that the support assembly 100 can also better bond with the flexible display panel in the first state, thereby providing good support for the flexible display panel.

Exemplarily, as shown in FIG. 1, FIG. 2, FIG. 3, FIG. 4, FIG. 5 and FIG. 6, in some embodiments of the present disclosure, multiple first support units 1 and multiple second support units 2 can be provided in the support assembly 100. In the second state, the first support units 1 and the second support units 2 are alternately arranged along a first direction h1, a second embedding portion T2 is provided in the first support unit 1, and a second imbedding portion T2 is provided in the second support unit 2. In the first state, as shown in FIG. 1 and FIG. 3, the second embedding portion T2 of the first support unit 1 is embedded in the second recessing portion A2 of the second support unit 2 adjacent to the first support unit 1. That is, any adjacent first support unit 1 and second support unit 2 can be embedded with each other. In this way, the size of the single first support unit 1 and the single second support unit 2 can be designed to be small, and in the first state, the support assembly 100 formed by the first support unit 1 and the second support unit 2 can have a shape tending to be a smooth arc, so as to adapt to a flexible display panel with a smaller bending radius, and to support the flexible display panel in a bending state more stably.

As shown in FIG. 1, FIG. 2, FIG. 3. FIG. 4, FIG. 5, and FIG. 6, the first support unit 1 can include a fifth surface S13 and a sixth surface S14. The first surface S11 and the second surface S11 are connected by the fifth surface S13. The first surface S11 and the second surface S12 are connected by the sixth surface S14. The second support unit 2 can include a seventh surface S23 and an eighth surface S24. The third surface S21 and the fourth surface S22 are connected by the seventh surface S23. The third surface S21 and the fourth surface S22 are connected by the eighth surface S24. In the second state, as shown in FIG. 2, FIG. 4, FIG. 5, and FIG. 6, the fifth surface S13 and the sixth surface S14 are opposite to each other along the first direction h1. The seventh surface S23 and the eighth surface S24 are opposite to each other along the first direction h1.

In some embodiments of the present disclosure, as shown in FIG. 1, FIG. 2, FIG. 3. FIG. 4, FIG. 5, and FIG. 6, the fifth surface S13 of the first support unit 1 is a non-planar structure, and is recessed toward the sixth surface S14 to form the first recessing portion A1. The seventh surface S23 of the second support unit 2 has a non-planar structure, and is recessed toward the eighth surface S24 to form the second recessing portion A2.

The fourth surface S22 and the eighth surface S24 of the second support unit 2 intersect with each other to form a side surface of the first embedded portion T1, and a portion of the fourth surface S22 close to the eighth surface S24 intersects with the eighth surface S24 to form another side surface of the first embedded portion T1. The second surface S12 and the sixth surface S14 of the first support unit 1 intersect with each other to form a side surface of the second embedding portion T2, and a portion of the second surface S12 close to the sixth surface S14 intersects with the sixth surface S14 to form another side surface of the second embedding portion T2.

Exemplarily, as shown in FIG. 1, FIG. 2, FIG. 3, FIG. 4, FIG. 5, and FIG. 6, the fifth surface S13 of the first support unit 1 includes a first sub-surface S131 and a second sub-surface S132 that intersect with each other. The first sub-surface S131 is located at a side of the second sub-surface S132 close to the second surface S12. Exemplarily, the first sub-surface S131 intersects with the second surface S12. The second sub-surface S132 intersects with the first surface S11. The first sub-surface S131 and the second sub-surface S132 intersect at a first intersection line located at a side of the first sub-surface S131 close to the sixth surface S14. In this way, the first sub-surface S131 and the second sub-surface S132 can form two side surfaces of the first recessing portion A1 correspondingly.

Exemplarily, in the first state, as shown in FIG. 1 and FIG. 3, in some embodiments of the present disclosure, at least part of the fourth surface S22 of the second supporting unit 2 can be bonded to the first sub-surface S131 of the first supporting unit 1, and at least part of the eighth surface S24 of the second support unit 2 can be bonded to the second sub-surface S132 of the first support unit 1, so as to improve the structural stability of the support assembly 100 in the first state.

As shown in FIG. 1, FIG. 2, FIG. 3, FIG. 4, FIG. 5, and FIG. 6, the seventh surface S23 of the second supporting unit 2 includes a third sub-surface S231 and a fourth sub-surface S232 that intersect with each other. The third surface S231 is located at a side of the fourth sub-surface S232 close to the fourth surface S22. Exemplarily, the third sub-surface S231 intersects with the fourth surface S22, and the fourth sub-surface S232 intersects with the third surface S21. An intersection line where the third sub-surface S231 and the fourth sub-surface S232 intersect is located at a side of the third sub-surface S231 close to the eighth surface S24. In this way, the third sub-surface S231 and the fourth sub-surface S232 can form two side surfaces of the second recessing portion A2 correspondingly.

Exemplarily, in the first state, as shown in FIG. 1 and FIG. 3, in some embodiments of the present disclosure, at least part of the second surface S12 of the first support unit 1 is bonded to the third sub-surface S231 of the second support unit 2, and at least part of the sixth surface S14 of the first support unit 1 is bonded to the fourth sub-surface S232 of the second support unit 2, thereby improving the structural stability of the support assembly 100 in the first state.

Exemplarily, in some embodiments of the present disclosure, the first support unit 1 and the second support unit 2 can have a same shape and a same size. In some embodiments of the present disclosure, the first surface S11 and the third surface S21 can have a same shape and a same area, and the second surface S12 and the fourth surface S22 can have a same shape and a same area, the fifth surface S13 and the seventh surface S23 can have a same shape and a same area, and the sixth surface S14 and the eighth surface S24 can have a same shape and a same area. When the fifth surface S13 includes the first sub-surface S131 and the second sub-surface S132 and the seventh surface S23 includes the third sub-surface S231 and the fourth sub-surface S232, in the embodiments of the present disclosure, the first sub-surface S131 and the third sub-surface S231 have a same shape and a same area, and the second sub-surface S132 and the fourth sub-surface S232 have a same shape and a same area. In this way, the first support unit 1 and the second support unit 2 can be manufactured by using a same process, which simplifies the manufacturing process of the support assembly 100.

Exemplarily, as shown in FIG. 1, FIG. 2, FIG. 3. FIG. 4, FIG. 5 and FIG. 6, in some embodiments of the present disclosure, an area of the first surface S11 can be larger than an area of the second surface S12, and an area of the third surface S21 can be larger than an area of the fourth surface S22. On a first cross-section parallel to the first direction h1 and the second direction h2, a length L1 of the first surface S11 and a length L2 of the second surface S12 satisfy L1>L2. With such configuration, the flexible display panel can be provided at a side of the first surface S11 and a side of the third surface S21, so that the support assembly 100 in the second state has a plane at a side of the first surface S11 and the third surface S21. In the first state, the support assembly 100 can bend the whole including the flexible display panel and the support assembly 100 outward, so that in the first state, the displaying image on the flexible display panel can still be observed by human eyes.

Exemplarily, as shown in FIG. 1, FIG. 2, FIG. 3, FIG. 4, FIG. 5, and FIG. 6, in some embodiments of the present disclosure, the first surface S11 and the second surface S12 can be parallel to each other, and the first surface S11 and the sixth surface S14 can be perpendicular to each other. That is, the sixth surface S14 is parallel to the thickness direction of the support member 100. With such configuration, the thickness uniformity at different positions of the first support unit 1 can be improved, and in the second state, the support assembly 100 can provide good support for the flexible display panel. Similarly, in some embodiments of the present disclosure, an angle formed between the fourth surface S22 and the eighth surface S24 in the second supporting unit 2 can also be a right angle.

Exemplarily, in the first state, for the first support unit 1 and the second support unit 2 that are adjacent to each other, as shown in FIG. 1 and FIG. 3, in some embodiments of the present disclosure, an angle $\eta_1$ formed between the first surface S11 and the third surface S21 satisfies $135° \leq \eta_1 < 180°$. Such configuration can make the transition between the first surface S11 and the third surface S21 gentler in the first state. When the flexible display panel 200 is subsequently provided at a side where the first surface S11 and the third surface S21 are located, the support assembly 100 can better match the flexible display panel 200 having a curved shape.

In some embodiments of the present disclosure, in the first state, for the first support unit 1 and the second support unit 2 that are adjacent to each other, as shown in FIG. 1 and FIG. 3, an angle $\eta_2$ formed between the second surface S12 and the fourth surface S22 satisfies $135° \leq \eta_2 < 180°$. Such configuration can make the transition between the second surface S12 and the fourth surface S22 gentler in the first state. When a rotating column is subsequently provided at a side where the second surface S12 and the fourth surface S22 are located, the support assembly 100 can better match the shape of a rotating column with a circular cross-section.

Exemplarily, in some embodiments of the present disclosure, $\eta_1 = \eta_2$.

Exemplarily, when the support assembly 100 includes multiple first support units 1 and multiple second support units 2, in the first state, an angle formed between any adjacent first surface S11 and third surfaces S21 can be $\eta_1$, and an angle formed between any adjacent second surface S12 and the fourth surface S22 can be $\eta_2$. In other words, in some embodiments of the present disclosure, a cross-sectional shape of the support assembly 100 including the first support unit 1 and the second support unit 2 in the first state can be at least a part of an N-polygon with a predetermined thickness. Exemplarily, $N \geq 8$. That is, $135° \leq \eta_2 < 180°$, so that the cross-sectional shape of the support assembly 100 tends to be an arc.

Figure 7:
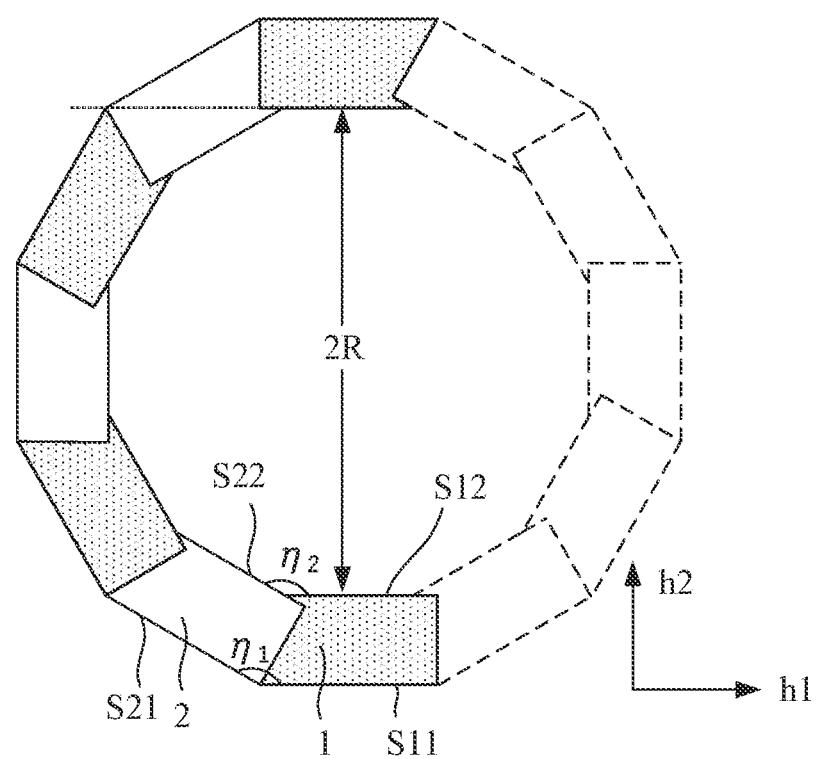
FIG. 7 is a schematic diagram of the correspondence between a support component and a N-regular-polygon provided by some embodiments of the present disclosure.

FIG. 7 is a schematic diagram of the correspondence between a support component and an N-regular-polygon provided by some embodiments of the present disclosure, where N=12. As shown in FIG. 7, a closed graph surrounded by a dotted line indicates that the first support unit and the second support unit are not provided at the corresponding positions. As can be seen from FIG. 7, in the first state, in a direction parallel to the first cross-section passing through the first direction h1 and the second direction h2, the first surface S11 of the first support unit 1 and the third surface S21 of the second support unit 2 can be regarded as parts of a regular dodecagon, and the second surface S12 of the first support unit 1 and the fourth surface S22 of the second support unit 2 can be regarded as parts of a regular dodecagon. In this way, in the first state, the cross-sectional shape of the support assembly 100 can tend to an arc, and the shapes of the support assembly 100 at different positions can be made to be consistent, so that the support effects of the flexible display panel 200 can be similar at different positions of the support assembly 100.

In some embodiments of the present disclosure, a distance T between the first surface S11 and the second surface S12 satisfies $100\ \mu m \leq T \leq 300\ \mu m$. In this way, on the one hand, it can ensure that the support assembly 100 has a strength to ensure the supporting effect of the support assembly 100 on the flexible display panel, and on the other hand, it can also ensure that the support assembly 100 can be better switch between the first state and the second state, thereby improving the flexibility of the support assembly 100, and avoiding bending the flexible display panel by the support assembly 100.

In some embodiments, as shown in FIG. 1, FIG. 2, FIG. 3, FIG. 4, FIG. 5, and FIG. 6, in some embodiments of the present disclosure, the first sub-surface S131 and the second sub-surface S132 of the first support unit 1 each can be set as a plane, and the fourth surface S22 and the eighth surface S24 of the second support unit 2 each can also be set as a plane. That is, a shape of a cross-section of the first support unit 1 parallel to the first direction h1 and the third direction h3 is a concave pentagon.

As shown in FIG. 4, a distance from an intersection line where the first sub-surface S131 and the second sub-surface S132 intersect to the sixth surface S14 is L3. In some embodiments of the present disclosure, L2>L3, so that the first recessing portion A1 is formed.

Figure 8:
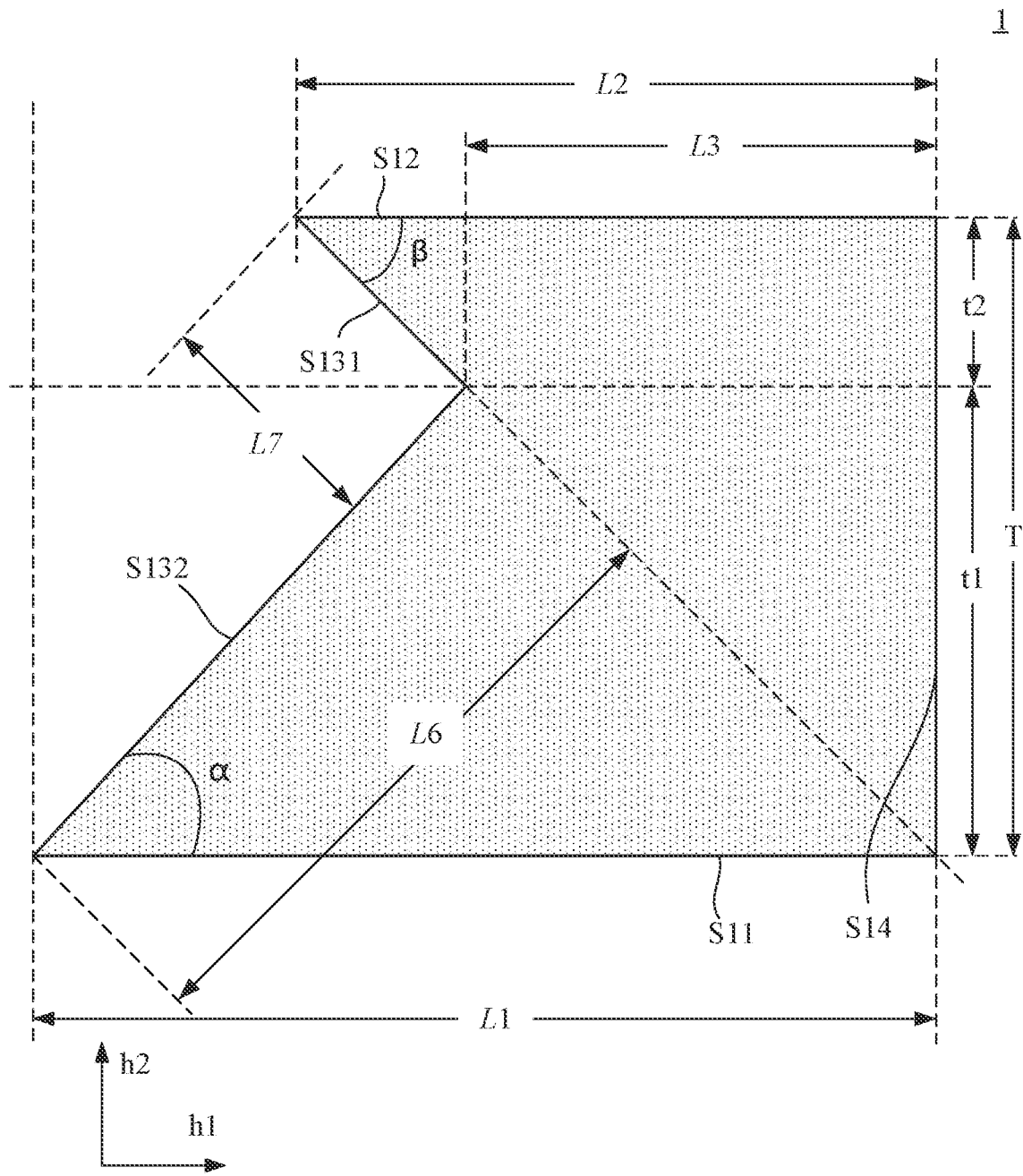
FIG. 8 is an enlarged schematic cross-sectional view of a first support unit provided by some embodiments of the present disclosure.

FIG. 8 is an enlarged schematic cross-sectional view of a first support unit provided by some embodiments of the present disclosure. Exemplarily, as shown in FIG. 3 and FIG. 8, in the first support unit 1, an angle formed between the first surface S11 and the second sub-surface S132 is $\alpha$, and an angle formed between the second surface S12 and the first sub-surface S131 is $\beta$. In some embodiments of the present disclosure, 0°<$\alpha$<90°, 0°<$\beta$<90°, so that the first sub-surface S131 and the second sub-surface S132 form two side surfaces of the first recessing portion A1.

Exemplarily, in some embodiments of the present disclosure, 45°≤$\alpha$<90°, and 0°<$\beta$<30°.

Exemplarily, in some embodiments of the present disclosure, the first embedding portion T1 and the first recessing portion A1 can be complementary in shapes, so that the first embedding portion T1 and the first recessing portion A1 are seamlessly embedded in the first state, thereby improving the strength of the support assembly 100 in the bending state.

In some embodiments of the present disclosure, $\alpha+\beta=90°$. That is, the angle formed between the first sub-surface S131 and the second sub-surface S132 is a right angle, so that the cross-section of the first recessing portion A1 has an "L"-like shape.

Referring to FIG. 4, a thickness T of the first support unit 1 is a distance between the first surface S11 and the second surface S12. The distance between the third surface S21 and the fourth surface S22 is a length of the eighth surface S24 in a direction parallel to a first cross-section passing through the first direction h1 and the second direction h2 is L5. A length of the second sub-surface S132 in a direction parallel to the first cross-section passing through the first direction h1 and the third direction h3 is L6. In some embodiments of the present disclosure, L6=L5=T. In this way, when the support assembly 100 is in the first state, as shown in FIG. 3, the eighth surface S24 of the second support unit 2 can be completely bonded to the second sub-surface S132 of the first support unit 1.

Exemplarily, as shown in FIG. 8, in some embodiments of the present disclosure, the first sub-surface S131 of the first support unit 1 can pass through the intersection line where the first surface S11 and the sixth surface S14 intersect. When the first support unit 1 is provided, in some embodiments of the present disclosure, L1−L2=T×[cos $\alpha$−tan $\alpha$×(1−sin $\alpha$)], and L1−L3=T×cos $\alpha$, so that in the first state, an inner surface and an outer surface of the support assembly 100 each can serve as a part of N-polygon. The inner surface of the support assembly 100 in the first state includes the second surface S12 of the first support unit 1 and the fourth surface S22 of the second support unit 2. The outer surface of the support assembly 100 in the first state includes the first surface S11 of the first support unit 1 and the third surface S21 of the second support unit 2. In some embodiments, for the first support unit 1 and the second support unit 2 that are adjacent to each other, a part of the fourth surface S22 of the second support unit 2 can be bonded to the first sub-surface S131 of the first support unit 1, and the eighth surface S24 of the second supporting unit 2 can be bonded to the second sub-surface S132 of the first supporting unit 1.

As shown in FIG. 3, in a direction parallel to the first cross-section passing through the first direction h1 and the third direction h3, the fourth surface S22 of the second support unit 2 has a length L4, and the first sub-surface S131 has a length L7, where L4=L2>L7, so that the part of the fourth surface S22 of the second support unit 2 close to the first support unit 1 is bonded to and in contact with the first sub-surface S131 of the first support unit 1, and the part of the fourth surface S22 of the second support unit 2 away from the first support unit 1 can serve as a side length of the inner surface of the support assembly 100, which can be matched with the rotating column subsequently.

In some embodiments of the present disclosure, in the first state, a gap can be formed between the fourth surface S22 of the second support unit 2 and the first sub-surface S131 of the first support unit 1, or, a gap can be formed between the eighth surface S24 of the support unit 2 and the second sub-surface S132 of the first support unit 1.

Figure 9:
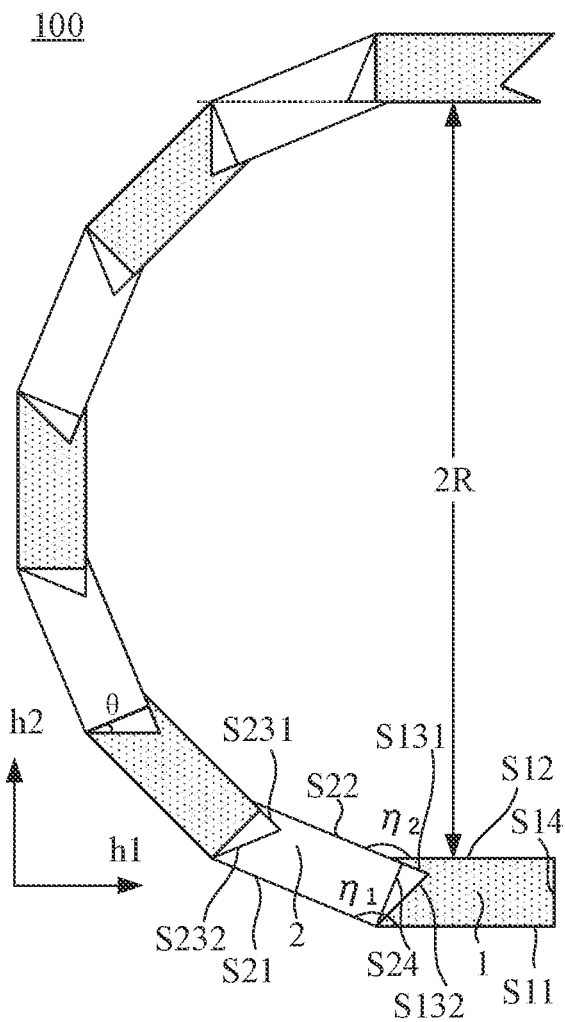
FIG. 9 is a schematic cross-sectional view of another support assembly in a first state provided by some embodiments of the present disclosure.
Figure 10:
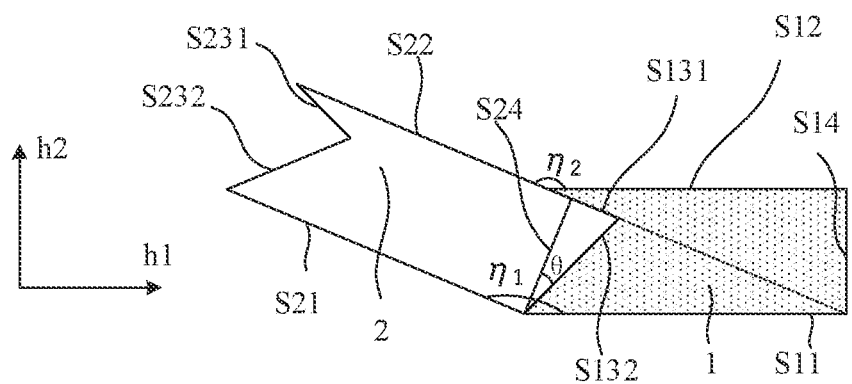
FIG. 10 is an enlarged schematic view of the adjacent first support unit and the second support unit in FIG. 9 provided by some embodiments of the present disclosure.
Figure 11:
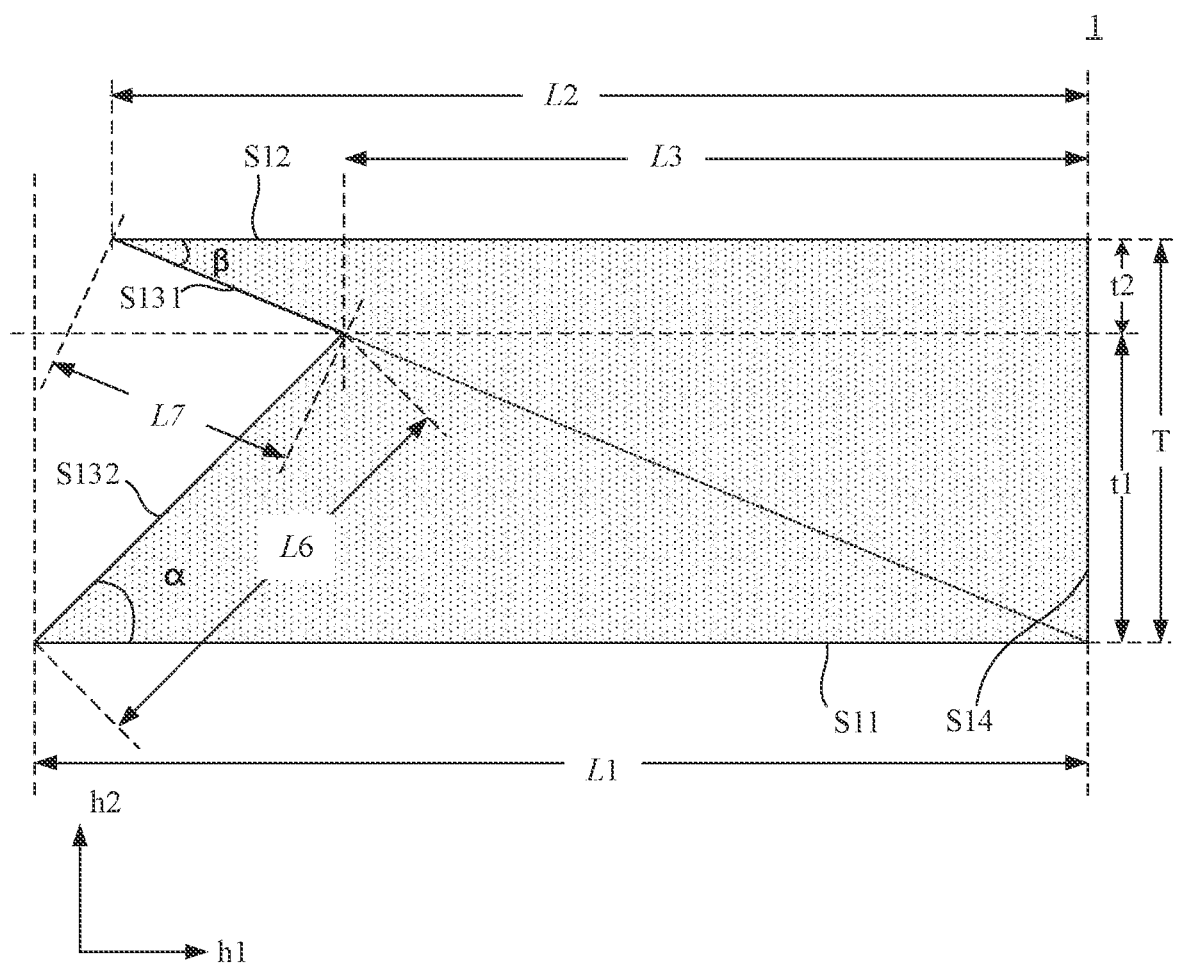
FIG. 11 is an enlarged schematic view of the first support unit in FIG. 9 provided by some embodiments of the present disclosure.

FIG. 9 is a schematic cross-sectional view of another support assembly in a first state provided by some embodiments of the present disclosure; FIG. 10 is an enlarged schematic view of the adjacent first support unit and the second support unit in FIG. 9 provided by some embodiments of the present disclosure; and FIG. 11 is an enlarged schematic view of the first support unit in FIG. 9 provided by some embodiments of the present disclosure. In some embodiments, as shown in FIG. 9, FIG. 10 and FIG. 11, in the first state, at least a part of the fourth surface S22 of the second support unit 2 is located between the first sub-surface S131 and the second sub-surface S132 of the first support unit 1, the eighth surface S24 of the second support unit 2 is located between the first sub-surface S131 and the second sub-surface S132 of the first support unit 1; and in the first state, a part of the fourth surface S22 of the second support unit 2 is bonded to a part of the first sub-surface S131 of the first support unit 1, a part of the eighth surface S24 of the second support unit 2 is not bonded to the second sub-surface S132 of the first support unit 1, i.e., a gap being between the eighth surface S24 and the second sub-surface S132. In this way, while the support assembly 100 has an approximate arc shape in the first state, and a gap can also be formed between the first support unit 1 and the second support unit 2, which facilitates heat dissipation while ensuring the structural stability.

As shown in FIG. 11, the first sub-surface S131 and the second sub-surface S132 each include a plane.

In some embodiments of the present disclosure, $\alpha+\beta<90$, that is, an angle formed between the first sub-surface S131 and the second sub-surface S132 can be an acute angle.

As shown in FIG. 9 and FIG. 10, in the first state, there is an angle $\theta$ between the eighth surface S24 of the second supporting unit 2 and the second sub-surface S132 of the first supporting unit 1. Exemplarily, in some embodiments of the present disclosure, $\alpha+\beta+\theta=90°$, so that the inner surface and the outer surface of the support assembly 100 in the first state are parallel to each other, and the cross-sectional shapes of both the inner surface and the outer surface are approximate arcs.

In some embodiments, as shown in FIG. 11, in some embodiments of the present disclosure, the first sub-surface S131 of the first support unit 1 passes through the intersection line where the first surface S11 and the sixth surface S14 intersect. Exemplarily, when designing the first support unit 1, in some embodiments of the present disclosure, $$L1 - L2 = \frac{T}{\sin(\alpha + \beta)} \times \left[\cos\alpha - \frac{\sin(\alpha + \beta) - \sin\alpha}{\tan\beta}\right],$$

$$\text{and } L1 - L3 = \frac{T \times \cos\alpha}{\sin(\alpha + \beta)},$$

so that in the first state, the inner surface and the outer surface of the support assembly 100 can both form a part of N-polygon, and, for the first supporting unit 1 and the second supporting unit 2 that are adjacent to each other, a part of the fourth surface S22 of the second supporting unit 2 is bonded to the first sub-surface S131 of the first supporting unit 1, and the eighth surface S24 of the second support unit 2 is not bonded to the second sub-surface S132 of the first support unit 1, so that there is gap formed between the first support unit 1 and the second support unit 2, thereby improving the heat dissipation effect of the support assembly.

The angle formed between the first surface S1 and the third surface S21 shown in FIG. 9 only exemplarily illustrated. When a gap is set between the first support unit 1 and the second support unit 2, the angle formed between the first surface S11 and the third surface S21 can also be set to other angles, which is not limited in the present disclosure.

As described above, in the first state, the shape of the support assembly 100 in the direction parallel to the first cross-section passing through the first direction h1 and the second direction h2 can be at least a part of a regular N-polygon.

Figure 12:
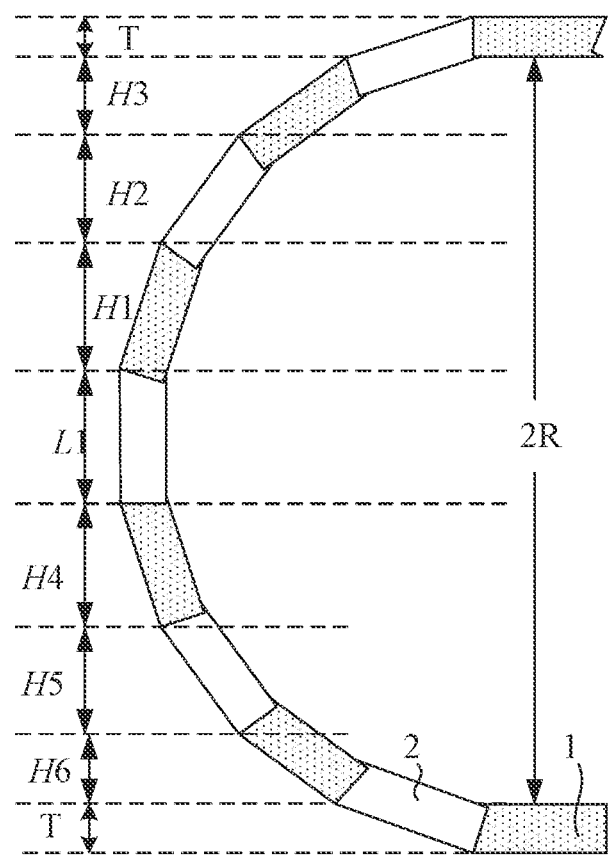
FIG. 12 is a schematic cross-sectional view of another support assembly in a first state provided by some embodiments of the present disclosure.

FIG. 12 is a schematic cross-sectional view of another support assembly in a first state provided by some embodiments of the present disclosure. In some embodiments, in the first state, as shown in FIG. 3, FIG. 7, FIG. 9, and FIG. 12, a distance between two parallel sides in the inner surface of the support assembly 100 is 2R, where R can be a radius of the rotating column subsequently provided at a side of the inner surface of the support assembly 100. The support assembly 100 in FIG. 4 corresponds to a regular octagon, the support assembly 100 in FIG. 7 corresponds to a regular dodecagon, and the support assembly 100 in FIG. 9 corresponds to a regular hexagon. The support assembly 100 in FIG. 12 corresponds to a regular icosagon.

Figure 13:
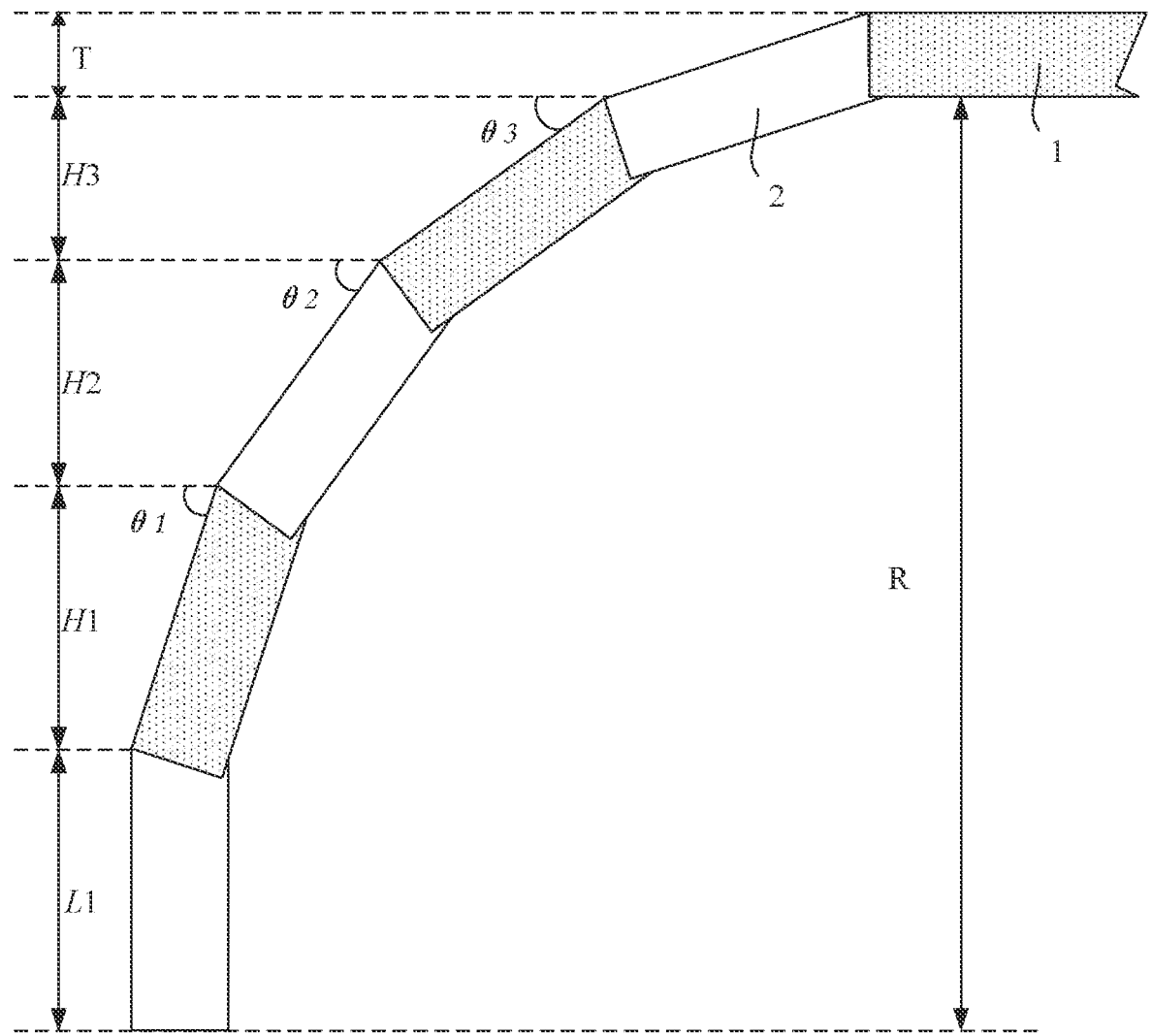
FIG. 13 is an enlarged schematic view of a part of the region in FIG. 12 provided by some embodiments of the present disclosure.

Taking the support assembly 100 corresponding to a regular icosagon as an example, according to FIG. 12, it can be obtained: 2R=L1+H1+H2+H3+H4+H5+H6. According to the symmetry of the regular polygon, H1=H4, H2=H5, H3=H6. FIG. 13 is an enlarged schematic view of a part of the region in FIG. 12 provided by some embodiments of the present disclosure. Referring to FIG. 13, θ1=α, θ2=2α−90°, and θ3=180°−2α.

According to the trigonometric relationship, it can be obtained:

$H1=L1 \sin\theta1=L1 \sin\alpha$;

$H2=L1 \sin\theta2=L1 \sin(2\alpha-90°)=-L1 \cos 2\alpha=L1 \cos 2\beta$; and $H3=L1 \sin\theta3=L1 \sin(180°-2\alpha)=L1 \sin 2\alpha=L1 \sin 2\beta$.

It is obtained: $2R=L1+2(H1+H2+H3)=L+2L(\sin\alpha+\cos 2\beta+\sin 2\beta)$.

Therefore, $R=L1/2+L1(\sin\alpha+\cos 2\beta+\sin 2\beta)$.

When N=20, L1−L3=T cos α<L1/10. Therefore, it can be obtained:

$T<R/[5 \cos\alpha(2 \sin\alpha+2 \cos 2\beta+2 \sin 2\beta+1)]$.

Therefore, when designing the support assembly 100, α and β that meet the above requirements can be selected according to the required thickness T of the support assembly 100 and the cross-sectional radius R of the rotating column matched with the support assembly 100.

Similar to the correspondence between the support assembly 100 and the regular icosagon, when the support assembly 100 corresponds to the regular octagon, as shown in FIG. 3, it can be obtained: R=L1/2 and T=R/cos α. When the support assembly 100 corresponds to a regular dodecagon, as shown in FIG. 7, it can be obtained: R=L1(2 sin α+1)/2 and T=R/[2 cos α(2 sin α+1)]. When the support assembly 100 corresponds to a regular hexagon, as shown in FIG. 9, it can be obtained: R=L1(2 cos α+2 cos β+1)/2 and T=(L1−L3)sin(α+β)/cos α<3R sin(α+β)/[5 cos α(2 cos α+2 cos β+1)].

FIG. 3, FIG. 7, FIG. 9 and FIG. 12 only take the support assembly 100 corresponding to a regular octagon, a regular dodecagon, a regular hexagon and a regular icosagon as an example to describe the support assembly 100, in fact, the support assembly 100 can also be set corresponding to other polygons, which will not be repeated herein.

Figure 14:
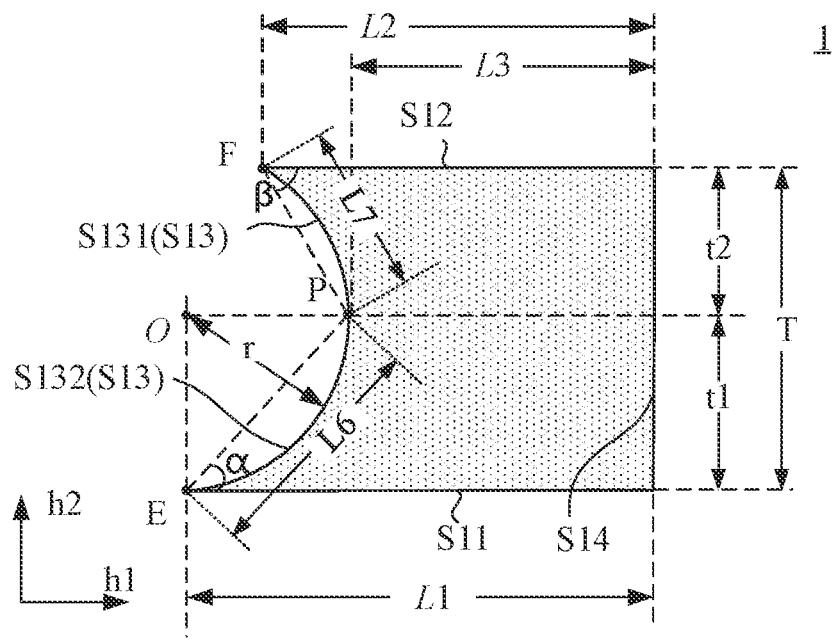
FIG. 14 is an enlarged schematic cross-sectional view of still another first support unit provided by some embodiments of the present disclosure.

In some embodiments of the present disclosure, the first sub-surface S131 can include a first curved surface, and/or, the second sub-surface S132 can include a second curved surface. In a case where the first sub-surface S131 is a first curved surface and the second sub-surface S132 is a second curved surface, exemplarily, the first curved surface and the second curved surface can be co-spherical in some embodiments of the present disclosure. FIG. 14 is an enlarged schematic cross-sectional view of still another first support unit provided by some embodiments of the present disclosure. Referring to FIG. 14, when the first curved surface and the second curved surface are co-spherical, the intersection line where the first curved surface and the second curved surface intersect is defined as a set of points in the first surface with the largest distance from the center O of the sphere along the first direction h1. As shown in FIG. 14, the intersection line where the first curved surface and the second curved surface intersect is represented by a point P in a direction parallel to the first cross-section passing through the first direction h1 and the second direction h2. A distance between the sphere center O and the point P is r, and r is a radius of the sphere where the first curved surface is located. In some embodiments of the present disclosure, a distance from the center O of the sphere where the first curved surface is located to the first surface S11 is defined as t1, and the distance from the center O of the sphere where the first curved surface is located to the second surface S12 is defined as t2, and, along a direction parallel to the first direction h1, the distance between the center O of the sphere where the first curved surface is located and the sixth surface S14 is defined as L1. In some embodiments of the present disclosure, t1=L6×sin α; t2=L7×sin β. The radius r of the sphere where the first curved surface is located satisfies: L1−L2<r<L1−L3.

When the first sub-surface includes the first curved surface and the second sub-plane includes the second curved surface, the angle α formed between the first surface S11 and the second sub-surface S132 is the angle formed between the first plane and the first surface S11, the first plane is parallel to the intersection line where the first curved surface and the second curved surface intersect, and is parallel to the intersection line where the first surface S11 and the second sub-surface S132 intersect; that is, the first plane is represented with a line segment EP indicated by a dashed line in the cross-sectional view shown in FIG. 14, and the length L6 of the second sub-surface S132 on the first cross-section is a distance between the intersection line where the first surface S11 and the second sub-surface S132 intersect and the intersection line where the first curved surface and the second curved surface intersect. That is. L6 is the length of the line segment EP indicated by the dashed line in the cross-sectional view shown in FIG. 14.

Similarly, the β used to represent the angle formed between the second surface S12 and the first sub-surface S131 is the angle formed between the second plane and the second surface S12, the second plane is parallel to the intersection line where the first curved surface and the second curved surface intersect, and is parallel to the intersection line where the second surface S12 and the first sub-surface S131 intersect. That is, the second plane is represented by a line segment FP indicated by a dashed line in the cross-sectional view shown in FIG. 14. The length L7 of the first sub-surface S131 on the first cross-section is the distance between the intersection line where the second surface S12 and the first sub-surface S131 intersect and the intersection line where the first curved surface and the second curved surface intersect. That is, L7 is the length of the line segment FP indicated by the dashed line in the cross-sectional view shown in FIG. 14.

The case where the second surface S12 and the sixth surface S14 are both set as planes shown in FIG. 14 is only for illustration. When the first sub-surface S131 of the first support unit 1 is set as a curved surface, correspondingly, in some embodiments of the present disclosure, at least part of the fourth surface S22 of the second support unit can also be set as a curved surface. When the second sub-surface S132 of the first support unit 1 is set as a curved surface, correspondingly, in some embodiments of the present disclosure, at least a part of the eighth surface S24 of the second support unit 2 can also be set as a curved surface.

Figure 15:
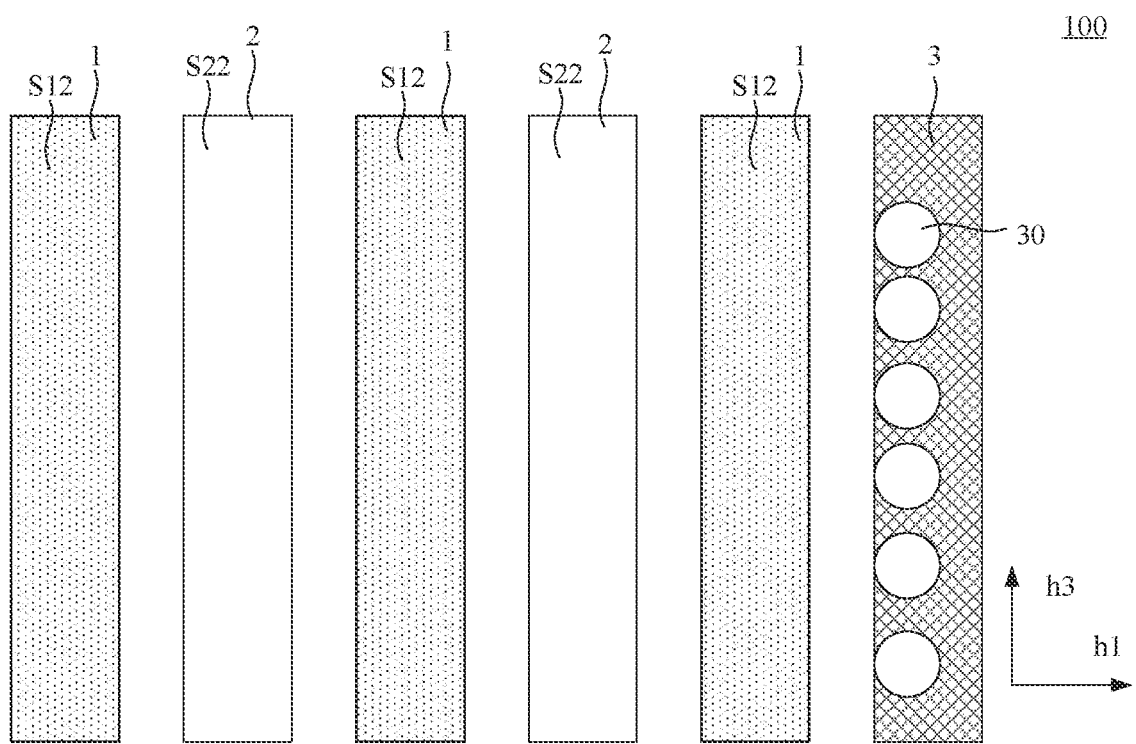
FIG. 15 is a schematic plan view of a surface of a support assembly away from a flexible display panel in a second state provided by some embodiments of the present disclosure.
Figure 16:
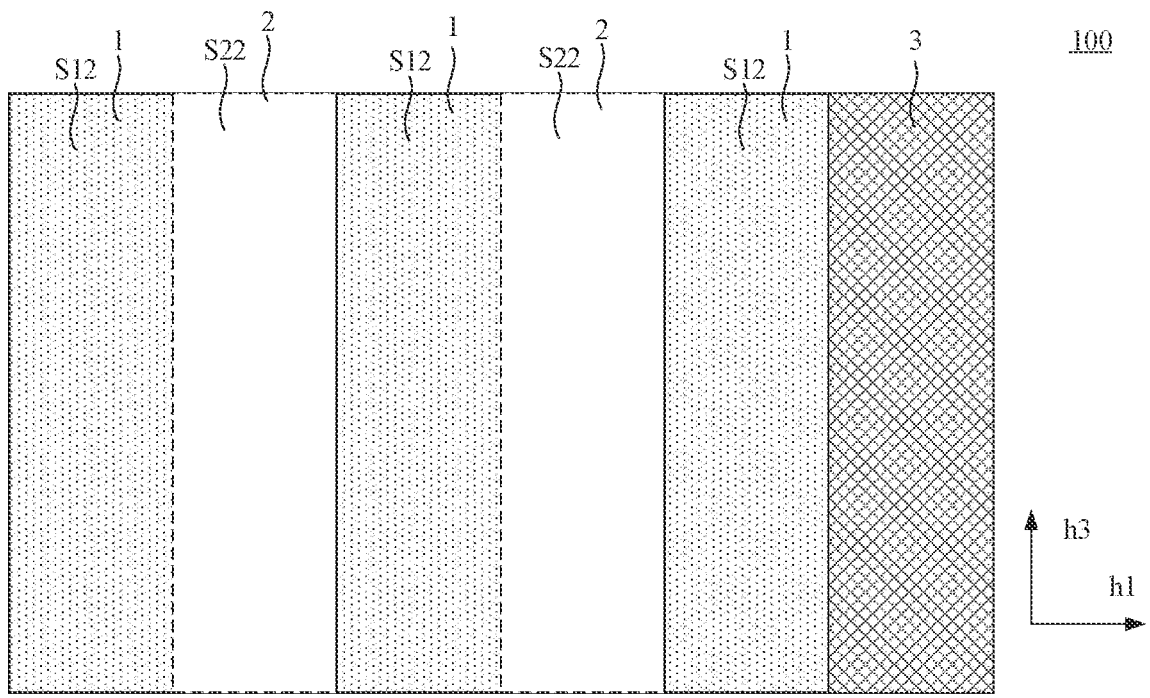
FIG. 16 is a schematic plan view of a surface of a support assembly close to a flexible display panel in a second state provided by some embodiments of the present disclosure.

FIG. 15 is a schematic plan view of a surface of a support assembly away from a flexible display panel in a second state provided by some embodiments of the present disclosure; and FIG. 16 is a schematic plan view of a surface of a support assembly close to a flexible display panel in a second state provided by some embodiments of the present disclosure. Exemplarily, as shown in FIG. 15 and FIG. 16, the surface of the support assembly 100 close to the flexible display panel includes the first surface S11 of the first support unit 1 and the third surface S21 of the second support unit 2, and the surface of the support assembly 100 away from the flexible display panel includes the second surface S12 of the first support unit 1 and the fourth surface S22 of the second support unit 2. The support assembly 100 can includes a third support unit 3 that is located at a side of the first support unit 1 away from the second support unit 2. Exemplarily, the third support unit 3 can be located at the edge of the support assembly 100. The third support unit 3 includes a connection hole 30. Exemplarily, the connection hole 30 can be a blind hole, that is, the connection hole 30 does not penetrate through the third support unit 3. When a display apparatus includes the support assembly 100, the connection hole 30 is configured to connect the support assembly 100 and a housing (not shown) of the display apparatus.

Exemplarily, the first support unit 1 and the second support unit 2 that are adjacent to each other can be hinged to each other, so that the angle formed between the first support unit 1 and the second support unit 2 can be adjusted, realizing the switch of the support assembly 100 between the first state and the second state.

Exemplarily, the support assembly 100 that includes the first support unit 1 and the second support unit 2 can be manufactured by any one or more process of stamping, CNC, and etching.

The present disclosure further provides a display apparatus. The display apparatus includes a display panel and the above support assembly. Exemplarily, the display panel can be a flexible display panel including multiple light emitting units with different colors. The light-emitting unit includes any one or more of organic light-emitting devices, micro light-emitting diode devices, and quantum dot light-emitting devices. In some embodiments, the above-mentioned display panel can be integrated with a touch function.

Operating states of the display apparatus include a first state and a second state. The first state includes a state in which a part region of the display panel is bent, and the second state includes a state in which all regions of the display panel are unfolded.

Figure 17:
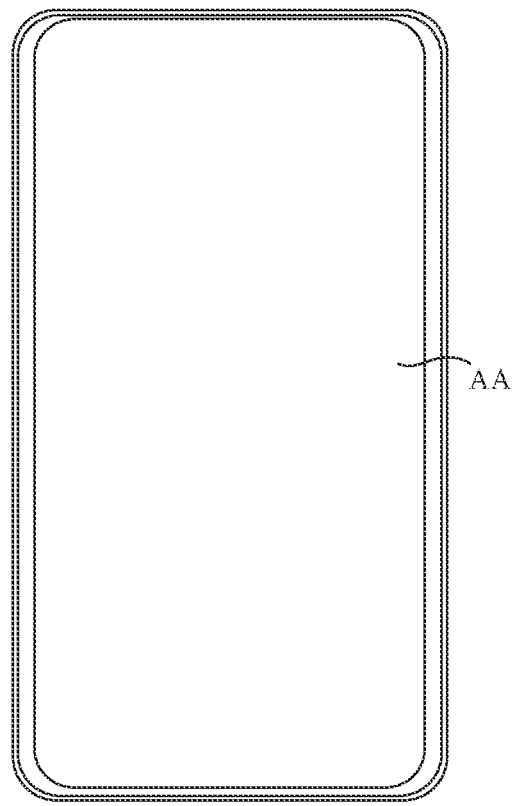
FIG. 17 is a schematic diagram of a display apparatus in a first state provided by some embodiments of the present disclosure.
Figure 18:
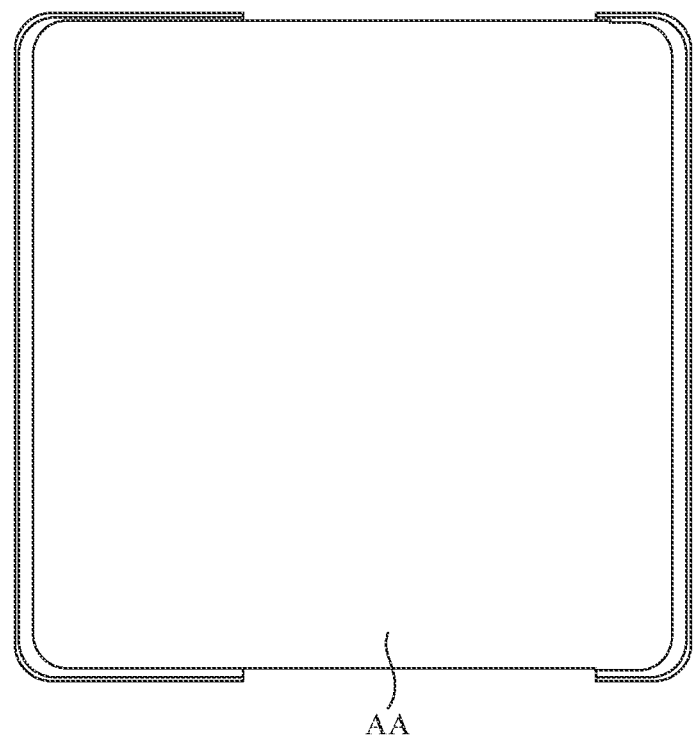
FIG. 18 is a schematic diagram of a display apparatus in a second state provided by some embodiments of the present disclosure.

Exemplarily, the display apparatus can be a sliding scroll display apparatus. The sliding scroll display apparatus is a display apparatus with an expandable size of the display region, which can increase or decrease the screen size as required. FIG. 17 is a schematic diagram of a display apparatus in a first state provided by some embodiments of the present disclosure, and FIG. 18 is a schematic diagram of a display apparatus in a second state provided by some embodiments of the present disclosure. In some embodiments, as shown in FIG. 7 and FIG. 8, when the display apparatus is a sliding scroll display apparatus with an adjustable display region, the first state includes a state in which the area of the display region AA of the display apparatus is small, and the second state includes a state in which the display region AA of the display apparatus is the largest.

In some embodiments, when the display apparatus is a foldable display apparatus, the first state includes a folding state of the foldable display apparatus, and the second state includes an unfolding state of the foldable display apparatus.

The specific structure of the support assembly has been described in detail in the above embodiments, and will not be repeated herein. It is appreciated that the display apparatuses shown in FIG. 17 and FIG. 18 are only schematic illustrations, and can be any electronic device with display function, such as a mobile phone, a tablet computer, a laptop computer, an electronic paper book, or a television.

Figure 19:
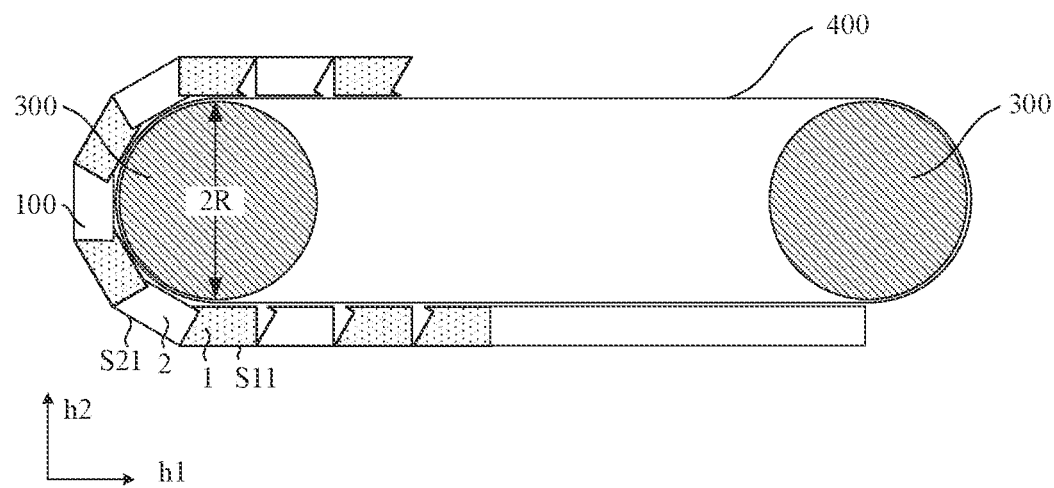
FIG. 19 is a schematic cross-sectional view of a display apparatus provided by some embodiments of the present disclosure.

FIG. 19 is a schematic cross-sectional view of a display apparatus provided by some embodiments of the present disclosure. Exemplarily, as shown in FIG. 19, the display apparatus can include a rotating column 300 and a caterpillar 400. The caterpillar 400 is sleeved at a side of the rotating column 300. The support assembly 100 is located at a side of the caterpillar 400 away from the rotating column 300. The display panel is located at a side of the support assembly 100 away from the caterpillar 400. The arrangement of the rotating column 300 and the caterpillar 400 facilitates the movement and stay of the support assembly 100 and the display panel on a fixed track. An accommodating space formed by the caterpillar 400 can separate the driving devices and circuit devices required for the operation of the display apparatus from the display panel, which is beneficial to prevent the infiltration of foreign objects. FIG. 19 schematically illustrates that the display apparatus includes two rotating columns 3).

Exemplarily, the housing of the display apparatus includes an extension shell and a rolling-up shell. When the area of the display region of the display apparatus needs to be enlarged, the extension shell moves in an unfolding direction after being triggered to drive the support assembly and the display panel on it, so that the area of the display region of the display apparatus is increased. When the area of the display region of the display apparatus needs to be reduced, the rolling-up shell moves along the rolling-up direction after being triggered, so that the area of the display region of the display apparatus is reduced.

In some embodiments of the present disclosure, the first support unit 1 and the second support unit 2 in the support assembly 100 each are parallel to an axis of the rotating column 300.

The above are merely some embodiments of the present disclosure, rather than limiting the present disclosure. Any modification, equivalent substitution, improvement, and so on, made within the principles of the present disclosure shall fall into the protection scope of the present disclosure.

What is claimed is:

1. A support assembly, comprising:
   at least one first support unit, wherein one first support unit of the at least one first support unit comprises a first recessing portion, and comprises a first surface and a second surface that are opposite to each other; and
   at least one second support unit, wherein one second support unit of the at least one second support unit comprises a first embedding portion, and comprises a third surface and a fourth surface that are opposite to each other,
   wherein the support assembly has operating states comprising a first state and a second state, wherein in the first state, the first embedding portion is embedded in the first recessing portion; and in the second state, one end of the first surface and one end of the third surface are disposed in a same horizontal plane and abut against each other, the second surface and the fourth surface are located at a same side of the support assembly, and a remaining part of the first support unit, except the end of the first surface, is separated from a remaining part of the second support unit except the end of the third surface.

2. The support assembly according to claim 1, wherein the at least one first support unit comprises a plurality of first support units, and the at least one second support unit comprises a plurality of second support units, and the plurality of first support units and the plurality of second support units are alternately arranged;
   wherein one of the plurality of first support units comprises a second embedding portion, and one of the plurality of second support units comprises a second recessing portion; and
   wherein, in the first state, the second embedding portion is embedded in the second recessing portion.

3. The support assembly according to claim 1, wherein one of the at least one first support unit and one of the at least one second support unit have a same shape.

4. The support assembly according to claim 1, wherein the first surface and the second surface are opposite to each other along a thickness direction of the support assembly, and the first surface has a larger area than the second surface; the one of the at least one first support unit further comprises a fifth surface and a sixth surface that are opposite to each other; and the fifth surface is recessed toward the sixth surface to form the first recessing portion; and
   wherein the third surface and the fourth surface are opposite to each other along the thickness direction of the support assembly, and the third surface has a larger area than the fourth surface; the one of the at least one second support unit further comprises a seventh surface and an eighth surface that are opposite to each other; and the fourth surface and the eighth surface intersect to form the first embedding portion.

5. The support assembly according to claim 4, wherein the fifth surface comprises a first sub-surface and a second sub-surface that intersect with each other, wherein the first sub-surface is located at a side of the second sub-surface close to the second surface; where the first sub-surface and the second sub-surface intersect at a first intersection line that is located at a side of the first sub-surface close to the sixth surface; and
   wherein, in the first state, at least a part of the fourth surface is bonded to the first sub-surface, and at least a part of the eighth surface is bonded to the second sub-surface.

6. The support assembly according to claim 5, wherein an angle formed between the first surface and the second sub-surface is $\alpha$, an angle formed between the second surface and the first sub-surface is $\beta$, and a distance between the first surface and the second surface is T;
   wherein the support assembly has a first cross-section, the first cross-section is parallel to a direction along which the at least one first support unit and the at least one second support unit are arranged, and is parallel to the thickness direction of the support assembly, the first surface and the first cross-section intersect at a second intersection line having a length L1, the second surface and the first cross-section intersect at a third intersection line having a length L2; and a distance from the first intersection line to the sixth surface is L3; and $$L1-L2=T\times[\cos\alpha-\tan\alpha\times(1-\sin\alpha)]; \text{ and } L1-L3=T\times\cos\alpha.$$

7. The support assembly according to claim 6, wherein the fourth surface and the first cross-section intersect at a fourth intersection line having a length L4, and the eighth surface and the first cross-section intersect at a fifth intersection line having a length L5,
   wherein the second sub-surface and the first cross-section intersect at a sixth intersection line having a length L6, where L6=L5; and
   wherein the first sub-surface and the first cross-section intersect at a seventh intersection line having a length L7, where L7<L4.

8. The support assembly according to claim 7, wherein the first sub-surface comprises a first curved surface, the second sub-surface comprises a second curved surface, and the first curved surface and the second curved surface are co-spherical; a distance t1 from a center of a sphere where the first curved surface is located to the first surface satisfy t1=L6×sin $\alpha$; a distance t2 from the center of the sphere where the first curved surface is located to the second surface satisfy t2=L7×sin $\beta$; and a distance from the center of the sphere where the first curved surface is located to the sixth surface is L1; and
   wherein a radius r of the sphere where the first curved surface is located satisfies: L1−L2<r<L1−L3.

9. The support assembly according to claim 5, wherein the first sub-surface and the second sub-surface each comprise a plane, and an angle formed between the first sub-surface and the second sub-surface is a right angle.

10. The support assembly according to claim 4, wherein the fifth surface comprises a first sub-surface and a second sub-surface that intersect with each other, wherein the first sub-surface is located at a side of the second sub-surface close to the second surface; and the first sub-surface and the second sub-surface intersect at a first intersection line located at a side of the first sub-surface close to the sixth surface; and
  wherein, in the first state, a gap is formed between the fourth surface and the first sub-surface, or a gap is formed between the eighth surface and the second sub-surface.

11. The support assembly according to claim 10,
wherein an angle formed between the first surface and the second sub-surface is α, an angle formed between the second surface and the first sub-surface is β, and a distance between the first surface and the second surface is T;
wherein the support assembly has a first cross-section, the first cross-section is parallel to a direction along which the at least one first support unit and the at least one second support unit are arranged, and is parallel to the thickness direction of the support assembly, the first surface and the first cross-section intersect at a second intersection line having a length L1, the second surface and the first cross-section intersect at a third intersection line having a length L2; and a distance from the first intersection line to the fourth surface is L3; and $$L1 - L2 = \frac{T}{\sin(\alpha + \beta)} \times \left[\cos\alpha - \frac{\sin(\alpha + \beta) - \sin\alpha}{\tan\beta}\right],$$

and $L1 - L3 = \frac{T \times \cos\alpha}{\sin(\alpha + \beta)}.$

12. The support assembly according to claim 11, wherein the first sub-surface comprises a first curved surface, the second sub-surface comprises a second curved surface, and the first curved surface and the second curved surface are co-spherical; a distance t1 from a center of a sphere where the first curved surface is located to the first surface satisfies t1=L6×sin α; a distance t2 from the center of the sphere where the first curved surface is located to the second surface satisfies t2=L7×sin β; a distance from the center of the sphere where the first curved surface is located to the sixth surface is L1; and a radius r of the sphere where the first curved surface is located satisfies: L1−L2<r<L1−L3; where L6 denotes a distance between the first intersection line and an intersection line where the first surface and the second sub-surface intersect; L7 denotes a distance between the first intersection line and an intersection line where the second surface and the first sub-surface intersect.

13. The support assembly according to claim 10, wherein the first sub-surface and the second sub-surface each comprise a plane, and the fourth surface and the eighth surface each comprise a plane; or
  an angle formed between the first sub-surface and the second sub-surface is an acute angle.

14. The support assembly according to claim 1, wherein, in the first state, an angle $\eta_1$ formed between the first surface and the third surface satisfies $135° \leq \eta_1 < 180°$; or
  in the first state, the first surface abuts against the third surface.

15. The support assembly according to claim 1, wherein a distance T between the first surface and the second surface satisfies 100 μm≤T≤300 μm.

16. The support assembly according to claim 1, further comprising:
  at least one third support unit, wherein one of the at least one third support unit is located at a side of the one of the at least one first support unit away from one of the at least one second support unit, and comprises a connection hole.

17. The support assembly according to claim 1, wherein the at least one first support unit and the at least one second support unit are hinged to each other.

18. A display apparatus, comprising:
  a display panel; and
  a support assembly,
  wherein the support assembly comprises:
  at least one first support unit, wherein one first support unit of the at least one first support unit comprises a first recessing portion, and comprises a first surface and a second surface that are opposite to each other; and
  at least one second support unit, wherein one second support unit of the at least one second support unit comprises a first embedding portion, and comprises a third surface and a fourth surface that are opposite to each other,
  wherein the support assembly has operating states comprising a first state and a second state, wherein, in the first state, the first embedding portion is embedded in the first recessing portion; and, in the second state, one end of the first surface and one end of the third surface are disposed in a same horizontal plane and abut against each other, the second surface and the fourth surface are located at a same side of the support assembly, and a remaining part of the first support unit, except the end of the first surface, is separated from a remaining part of the second support unit except the end of the third surface; and
  wherein the display panel is located at a side of the first surface away from the second surface.

19. The display apparatus according to claim 18, further comprising:
  a rotating column; and
  a caterpillar sleeved at a side surface of the rotating column,
  wherein the support assembly is located at a side of the caterpillar away from the rotating column.

20. The display apparatus according to claim 19, wherein the at least one first support unit and the at least one second support unit each extend in a direction parallel to an axis of the rotating column.

* * * * *